(12) United States Patent
Augustyn et al.

(10) Patent No.: US 7,006,198 B2
(45) Date of Patent: *Feb. 28, 2006

(54) SYSTEM AND METHOD FOR LASER BEAM EXPANSION

(75) Inventors: Walter Augustyn, Monroe, CT (US); James Tsacoyeanes, Southbury, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/970,411

(22) Filed: Oct. 22, 2004

(65) Prior Publication Data

US 2005/0083505 A1    Apr. 21, 2005

Related U.S. Application Data

(63) Continuation-in-part of application No. 10/270,561, filed on Oct. 16, 2002, now Pat. No. 6,819,402.

(60) Provisional application No. 60/329,757, filed on Oct. 18, 2001.

(51) Int. Cl.
*G03B 27/54* (2006.01)
*G03B 27/42* (2006.01)
*G02B 27/14* (2006.01)

(52) U.S. Cl. .......................... 355/67; 355/53; 359/629; 359/633; 359/634

(58) Field of Classification Search .................. 355/53, 355/67, 70; 359/619, 624, 627, 629, 633, 359/634

See application file for complete search history.

(56) References Cited

U.S. PATENT DOCUMENTS 4,997,261 A * 3/1991 Taniura ...................... 359/495
5,005,969 A    4/1991 Kataoka (Continued)

FOREIGN PATENT DOCUMENTS

EP    0 744 664 A2    11/1996
EP    1 139 174 A2    10/2001

OTHER PUBLICATIONS

Australian Patent Office Search Report, Appln. No. SG 200206363-4, Date of mailing of the search report, Sep. 1, 2004, 2 pages.

(Continued)

*Primary Examiner*—Alan Mathews
(74) *Attorney, Agent, or Firm*—Sterne, Kessler, Goldstein & Fox, P.L.L.C.

(57) ABSTRACT

The present invention relates to a method and system for expanding a laser beam. An illumination system includes a horizontal reflective multiplexer and a vertical reflective multiplexer. The horizontal reflective multiplexer replicates the input beam along a first dimension to form a first multiplexed beam. The vertical reflective multiplexer replicates the first multiplexed beam along a second dimension to form a second multiplexed beam. In one example, the horizontal reflective multiplexer includes a first beam splitter, second beam splitter, and mirror. The vertical reflective multiplexer includes a beam splitter and mirror.

15 Claims, 5 Drawing Sheets

U.S. PATENT DOCUMENTS

| | | |
|---|---|---|
| 5,224,200 A | 6/1993 | Rasmussen et al. |
| 5,343,489 A | 8/1994 | Wangler |
| 5,453,814 A | 9/1995 | Aiyer |
| 5,825,551 A | 10/1998 | Clarkson et al. |
| 5,861,991 A | 1/1999 | Fork |
| 5,896,188 A | 4/1999 | McCullough |
| 5,926,257 A | 7/1999 | Mizouchi |
| 6,002,523 A | 12/1999 | Tanaka |
| 6,275,514 B1 | 8/2001 | Katzir et al. |
| 6,801,299 B1 | 10/2004 | Kremer et al. |
| 6,819,402 B1 * | 11/2004 | Augustyn et al. ............. 355/67 |
| 2005/0036125 A1 | 2/2005 | Kremer et al. |

OTHER PUBLICATIONS

Communication date Aug. 9, 2005 from the European Patent Office.

* cited by examiner

SYSTEM AND METHOD FOR LASER BEAM EXPANSION

CROSS REFERENCE TO RELATED APPLICATIONS

This application is a continuation of U.S. patent application Ser. No. 10/270,561, filed Oct. 16, 2002, titled "System and Method for Laser Beam Expansion," which claims the benefit of U.S. Provisional Application No. 60/329,757, filed Oct. 18, 2001, each of which is hereby incorporated by reference herein in its entirety.

BACKGROUND OF THE INVENTION

1. Field of the Invention

The present invention relates to a system and method for expanding a laser beam.

2. Background Art

In many applications, the laser beam emitted by a laser needs to be expanded. Expansion of a laser beam is necessary in microlithography because a desired illumination system field is typically much bigger than the cross-sectional area of a beam emitted directly from the laser (also called a laser emission footprint). For example, one type of excimer laser beam has a laser emission footprint that is a generally rectangular area of about 5 mm×15 mm. On the other hand, an illumination system in a lithography tool may require an illumination field which is much larger on the order of 10 mm by 120 mm. This requires significant expansion of the laser beam.

One conventional approach for laser beam expansion involves the use of refractive elements, such as, a lens or prism structure. Unfortunately, expansion with such refractive elements increases the spatial coherence cell sizes of the laser and creates a speckle problem in the final image. To deal with the increasing spatial coherence cell sizes and bandwidth of the laser, a structure consisting of multiple lenses of different length has been used to expand the laser beam. Such a structure, however, is expensive and impractical for expanding a laser beam of reduced bandwidth to a degree involving hundreds or thousands of spatial cells.

Therefore, what is needed is an improved system and method for expanding a laser beam of reduced bandwidth.

BRIEF SUMMARY OF THE INVENTION

The present invention relates to a method and system for expanding a laser beam without increasing the spatially coherent cell sizes. In one embodiment, an illumination system includes a horizontal reflective multiplexer and a vertical reflective multiplexer. The horizontal reflective multiplexer receives an input laser beam. The horizontal reflective multiplexer replicates the input beam along a first dimension to form a first multiplexed beam. The first multiplexed beam is made up of a series of patches representing multiplexed copies of the input beam along the first dimension. The first multiplexed beam has a first expanded footprint which covers an area greater than the input footprint. The vertical reflective multiplexer replicates the first multiplexed beam along a second dimension to form a second multiplexed beam. The second multiplexed beam is made up of copies of the first multiplexed beam. The second multiplexed beam has a second expanded footprint that has an area even greater than the first expanded footprint.

According to a further feature of the present invention, the illumination system further includes an optical subsystem that re-images cell regions of the second multiplexed beam to overlap and form an output beam. The output beam has an output footprint covering the illumination field of the illumination system.

In one embodiment, the horizontal reflective multiplexer includes a first beam splitter, second beam splitter, and mirror. The vertical reflective multiplexer includes a beam splitter and mirror. The optical subsystem for re-imaging cell regions can include, but is not limited to, a micro-lens array or a diffractive optical element.

According to a further embodiment of the present invention a method for expanding a laser beam is provided. The method includes two replicating steps. The first replicating step replicates an input beam along a first dimension to form a first multiplexed beam having a first expanded footprint. The second replicating step replicates the first multiplexed beam along a second dimension to form a second multiplexed beam having a second expanded footprint. The method can also include re-imaging cell regions of the second multiplexed beam to overlap and form an output beam. The output has an output footprint covering an illumination field.

Further features and advantages of the present invention as well as the structure and operation of various embodiments of the present invention are described in detail below with reference to the accompanying drawings.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The present invention is described with reference to the accompanying drawings. In the drawings, like reference numerals indicate identical or functionally similar elements. Additionally, the left most digit of a reference number generally identifies the drawing in which the reference number first appears.

DETAILED DESCRIPTION OF THE INVENTION

The present invention relates to systems and methods for laser beam expansion. The present invention can be used in an illumination system in a variety of environments including, but not limited to, photolithography, holography, or any other type of laser illumination application. While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

Figure 1:
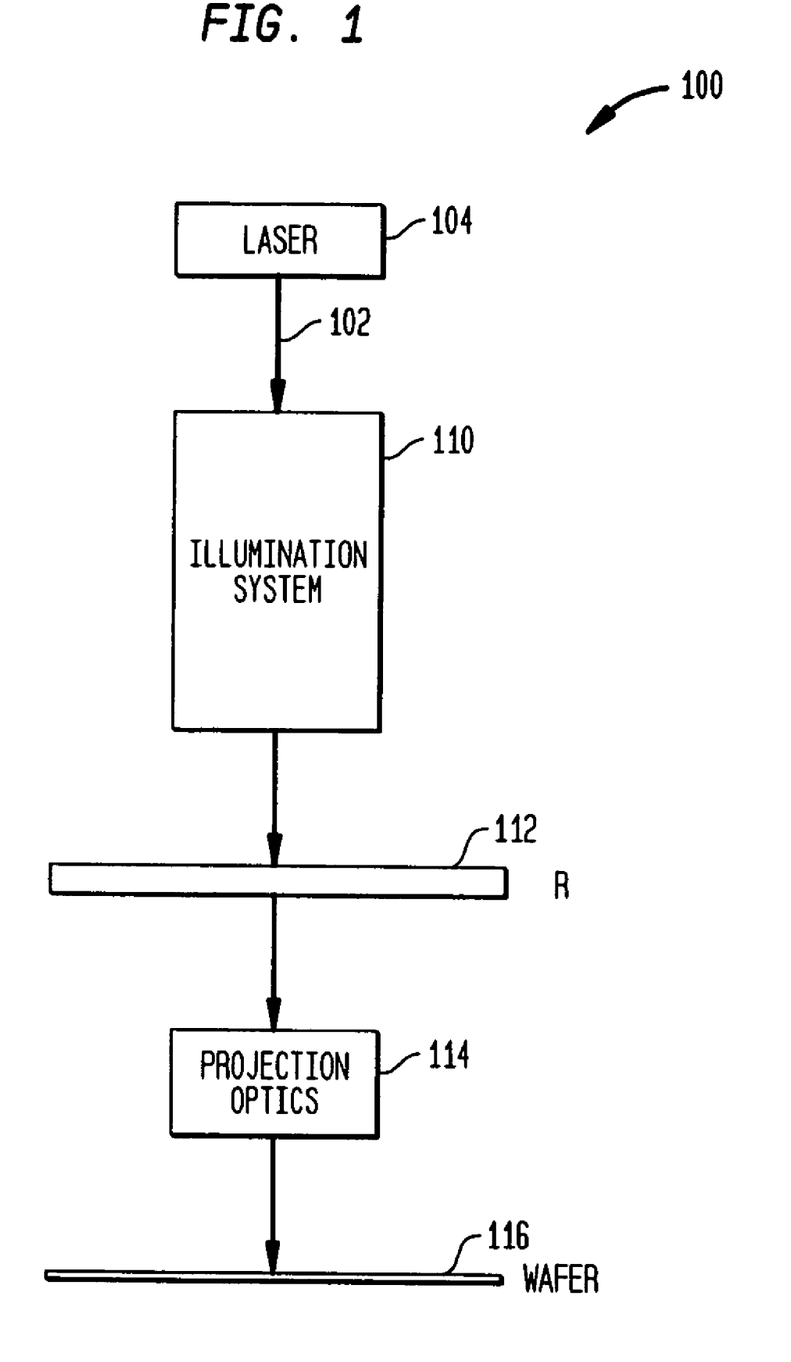
FIG. 1 is a diagram of a lithography system according to an embodiment of the present invention.

FIG. 1 is a diagram of a lithography system 100 according to an embodiment of the present invention. Lithography system 100 includes a laser 104, an illumination system 110, a reticle 112, projection optics 114, and a wafer 116. Laser 104 can be a excimer or deep ultraviolet (UV) excimer laser, or other type of known laser. Laser 104 emits a laser beam 102. Laser beam 102 travels along an optical axis to illumination system 110. Illumination system 110 expands the input laser beam 102 and outputs an expanded output beam 111 to reticle 112. In this way, illumination system 110 illuminates a region of reticle 112 that lies within an illumination field of the illumination system.

Light is either transmitted or reflected by reticle 112 depending upon the wavelength of the laser 104 and the type of material used in reticle 112. An image of the illuminated reticle region is then output to projection optics 114. Projection optics 114 then projects an image of the illuminated region of the reticle 112 onto wafer 116. Projection optics 114 can be any type of optical system for projecting a reticle image onto wafer 116. For example, projection optics 114 can be a series of lenses for further reducing the image of the reticle. In this way, lithography system 100 can be used to scan and expose wafer 116 to fabricate fine patterns of a semiconductor device design.

Illumination System with Beam Expansion

Figure 2:
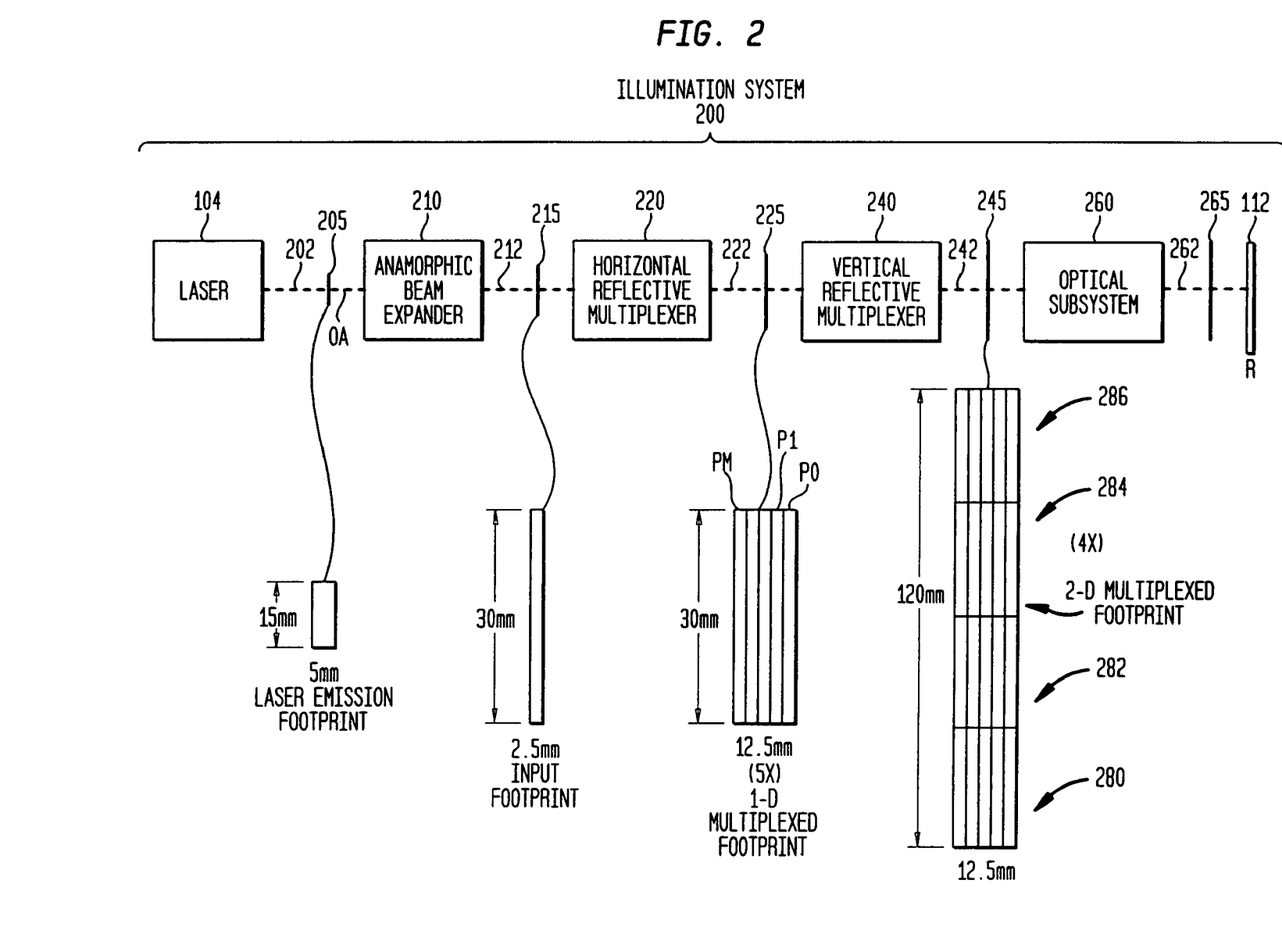
FIG. 2 is a diagram that illustrates an illumination system of FIG. 1 according to an embodiment of the present invention.

FIG. 2 is a diagram that shows illumination system 110 in further detail according to an embodiment of the present invention. Illumination system 110 includes anamorphic beam expander 210, horizontal reflective multiplexer 220, vertical reflective multiplexer 240, and optical subsystem 260. Illumination system 110 lies along an optical axis OA extending between laser 104 and reticle 112. Laser 104 emits a laser beam 202 to anamorphic beam expander 210. Beam 202 has a cross sectional area referred to as the laser emission footprint. The size of the laser emission footprint 205 depends upon the particular type and characteristics of laser 104. In one example, laser 104 is an excimer laser having a laser emission footprint 205 with a size of approximately 5 millimeters (mm)×15 mm as shown in FIG. 2.

Anamorphic beam expander 210 is provided to shape beam 202 to form input beam 212. According to one embodiment, anamorphic beam expander 210 comprises a cylindrical lens that reduces the footprint in a horizontal dimension (e.g., an x-axis direction) and increases the footprint in a vertical dimension (e.g., a y-axis direction). For example as shown in FIG. 2, anamorphic beam expander 210 shapes laser emission footprint 205 to form input footprint 215 having a size of approximately 2.5 mm×30 mm. Input beam 212 then proceeds along optical axis (OA) to horizontal reflective multiplexer 220. Anamorphic beam expander 210 is optional and can be omitted or replaced with a uniform beam expander depending upon a particular application.

Horizontal reflective multiplexer 220 replicates input beam 212 along a first horizontal dimension to form a first multiplexed beam 222. The first multiplexed beam 222 has a first expanded footprint 225 along the horizontal dimension (e.g., an x-axis direction). The structure and operation of horizontal reflective multiplexer 220 is described further below with respect to FIGS. 3A and 3B according to a example implementation of the present invention.

First multiplexed beam 222 then proceeds along optical axis OA to vertical reflective multiplexer 240. Vertical reflective multiplexer 240 replicates the first multiplexed beam 222 along a second dimension to form a second multiplexed beam 242. The second multiplexed beam 242 has a second expanded footprint 245. Vertical reflective multiplexer 240 expands beam 222 along a vertical dimension to create a two-dimensional multiplexed footprint 245.

Second multiplexed beam 242 is output to optical subsystem 260. Optical subsystem 260 re-images cell regions of second multiplexed beam 245 such that the cell regions overlap and form an output beam 262. Output beam 262 is incident upon reticle 112. Output beam 262 has an output footprint 265 that covers the illumination field of illumination system 110.

In one preferred embodiment, horizontal reflective multiplexer 220 replicates input beam 212 five times (5×) along the horizontal dimension to form first multiplexed beam 222. Beam 222 has a 1-D multiplexed footprint 225 with a size of approximately 12.5 mm×30 mm. As shown in FIG. 2, footprint 225 is made up of five patches P0, P1 . . . Pm where m equals 4. The patches are replications of input beam 212. Vertical reflective multiplexer 240 replicates first multiplexed beam 222 four times (4×) along the vertical dimension to form a second multiplexed beam 242. Beam 242 has a 2-D multiplexed footprint 245 with a size of approximately 12.5 mm×120 mm as shown in FIG. 2. Footprint 245 is made up of four areas or regions 280, 282, 284 and 286. Each region 280–286 is made up of a respective group of five patches. The groups of five patches in regions 280–286 are replications of the group of patches P0–Pm in the first multiplexed beam 212. The entire footprint 245 of the second multiplexed beam 242 is an array of 5×4 patches.

The present invention is not limited to 5× or 4× multiplexing in the horizontal and vertical dimensional. A greater or smaller number of replications can be performed. A greater or smaller number of patches can be used. The present invention is not limited to the order of elements shown in illumination system 110. For example, as an alternative vertical reflective multiplexer 240 can be placed before horizontal reflective multiplexer 220.

Figure 3A:
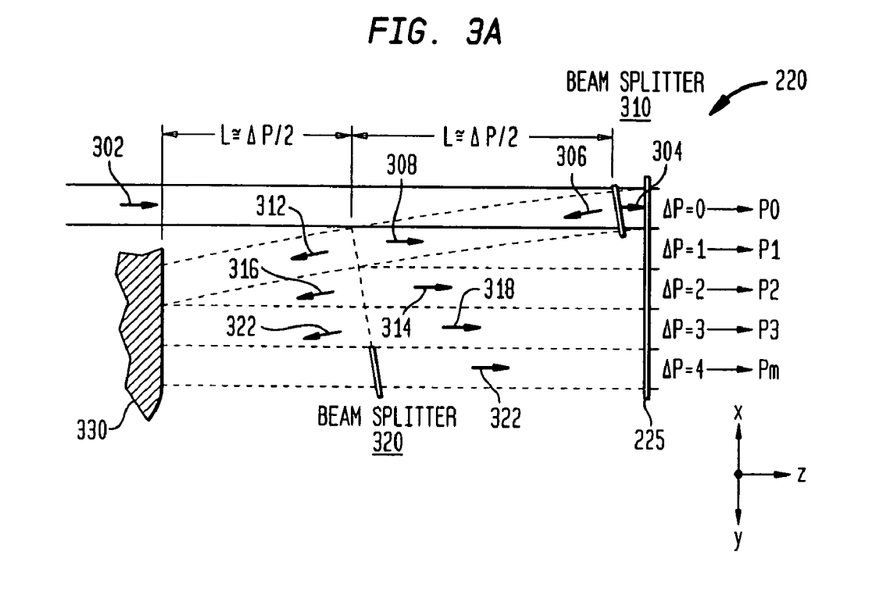
FIG. 3A is a diagram that illustrates the operation of a horizontal reflective multiplexer according to an embodiment of the present invention.

FIG. 3A is a diagram that the illustrates the structure and operation of horizontal reflective multiplexer 220 according to one example embodiment of the present invention. Horizontal reflective multiplexer 220 includes a first beam splitter 310, second beam splitter 320 and mirror 330. In one example arrangement, beam splitter 310 and beam splitter 320 are separated by a distance L along a z-direction. Beam splitter 320 and mirror 330 are also separated by a distance L along a z-direction. The distance L is set to be approximately equal to $\Delta P/2$ where $\Delta P$ is 1.4 times the coherence length of laser 104. Beam splitter 310, beam splitter 320 and mirror 330 are angled with respect to an input beam 302 and offset along an x-direction with respect to each other so that the input beam 302 is split and reflected to create multiple images of input beam 302 along the horizontal direction x.

As shown in FIG. 3A, input beam 302 is split by beam splitter 310 to form transmitted first beam portion 304 and reflected second beam portion 306. Transmitted first beam portion 304 is output as patch P0. Reflected second beam portion 306 travels to beam splitter 320. Beam splitter 320 splits beam portion 306 to create reflected third beam portion 308 and transmitted fourth beam portion 312.

Reflected third beam portion 308 is output as patch P1. Transmitted fourth beam portion 312 continues to mirror 330 and reflects back to beam splitter 320. Beam splitter 320 splits beam portion 312 into a transmitted fifth beam portion 314 and a reflected sixth beam portion 316. Transmitted fifth beam portion 314 is output as patch P2. Reflected sixth beam portion 316 travels to mirror 330 and reflects back to beam splitter 320. Beam splitter 320 splits beam portion 316 into a transmitted seventh beam portion 318 and a reflected eighth beam portion 322. Transmitted seventh beam portion 318 is output as patch P3. Reflected sixth beam portion 322 reflects from mirror 330 and is output as patch P4.

Figure 3B:
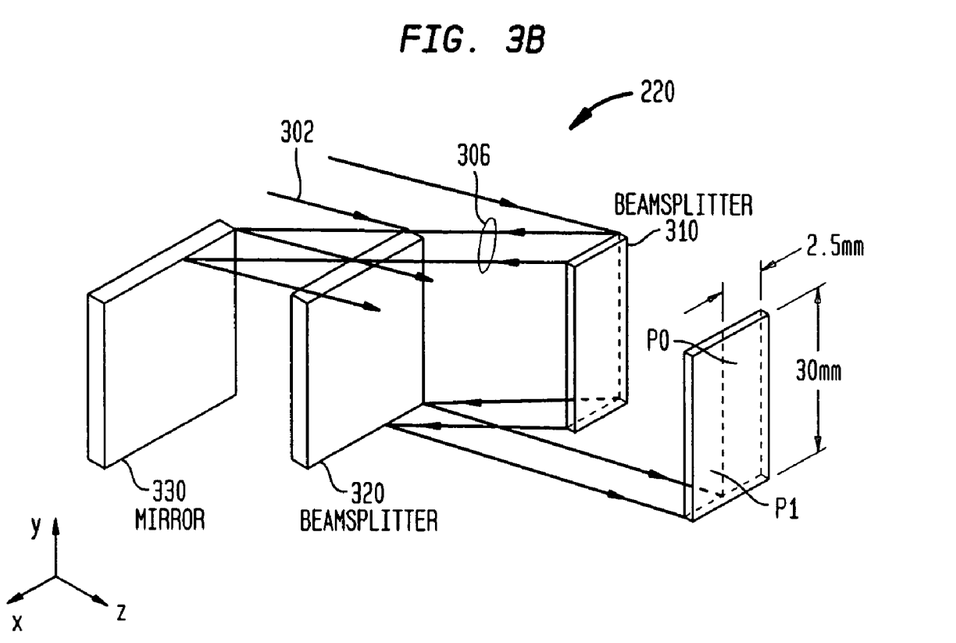
FIG. 3B is a perspective view of a horizontal reflective multiplexer according to an embodiment of the present invention.

FIG. 3B is a perspective view of horizontal reflective multiplexer 220 and shows beam splitter 310, beam splitter 320, and mirror 330 arranged along an xz plane. Beam splitter 310, beam splitter 320, and mirror 330 are arranged to replicate images of input beam 302 along the x direction to form patches P0–P4. For clarity, FIG. 3B only shows patches P0 and P1.

Figure 4:
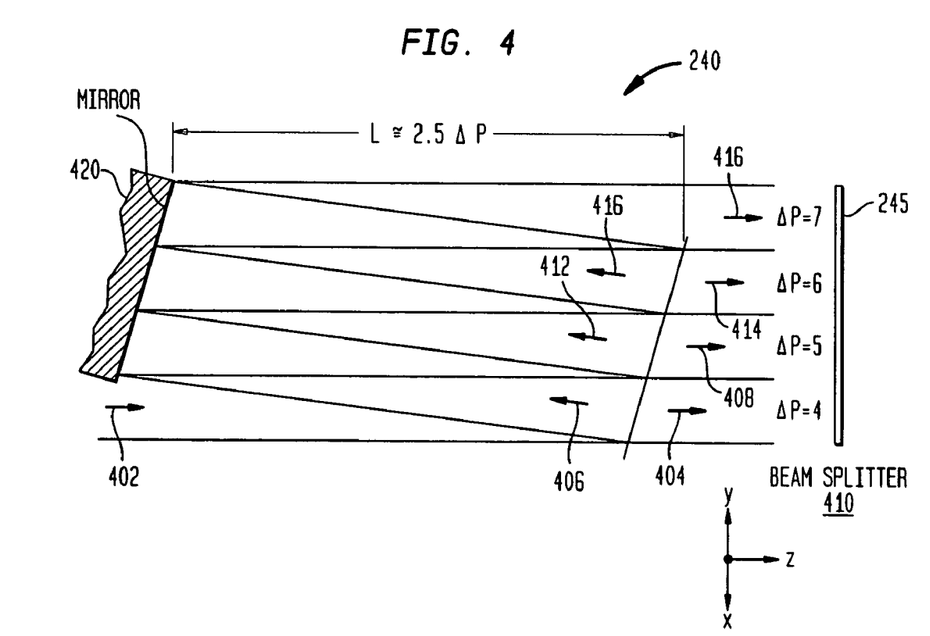
FIG. 4 is a diagram that illustrates the operation of a vertical reflective multiplexer according to an embodiment of the present invention.

FIG. 4 is a diagram of vertical reflective multiplexer 240 according to an example implementation of the present invention. Vertical reflective multiplexer 240 includes beam splitter 410 and mirror 420. An input beam 402 is split and reflected in vertical reflective multiplexer 240 to create multiple images of beam 402 along a vertical dimension (e.g., a y direction). As shown in FIG. 4, input beam 402 is split by beam splitter 410 to form transmitted beam portion 404 and reflected beam portion 406. Beam portion 404 is output as area 280. Reflected beam portion 406 reflects from beam splitter 410 to mirror 420 and then back to beam splitter 410. Beam splitter 410 splits beam portion 406 to form transmitted beam portion 408 and reflected beam portion 412. Beam portion 408 is output as area 282. Reflected beam portion 412 reflects from beam splitter 410 to mirror 420 and then back to beam splitter 410. Beam splitter 410 splits beam portion 412 to form transmitted beam portion 414 and reflected beam portion 416. Beam portion 414 is output as area 284. Reflected beam portion 416 reflects from mirror 420 and is output as area 286. In this way, a two-dimensional multiplexed beam having a 2-D multiplexed footprint 245 is output which includes replicated images of beam 402 in areas 280–286 along the vertical y dimension.

According to a further feature of the present invention, two-dimensional multiplexed footprint 245 is re-imaged by optical subsystem 260. Optical subsystem 260 re-images cell regions of footprint 245 such that the cell images are overlapped. Such overlap reduces the contrast of any remaining interference between rays making up the output beam. A uniform light intensity is thus obtained in the reimaged region incident upon reticle 112.

Illumination system 110 is most useful in any imaging apparatus or application which requires the use of a coherent light source where the coherence properties are deleterious to the final functioning of the instrument in which the source is used. In one implementation, illumination system 110 transforms a coherent laser source 104 into an incoherent source of 10,000 or more waves which are then made to overlap—reducing interference visibility to less than 1%.

Method

Figure 5:
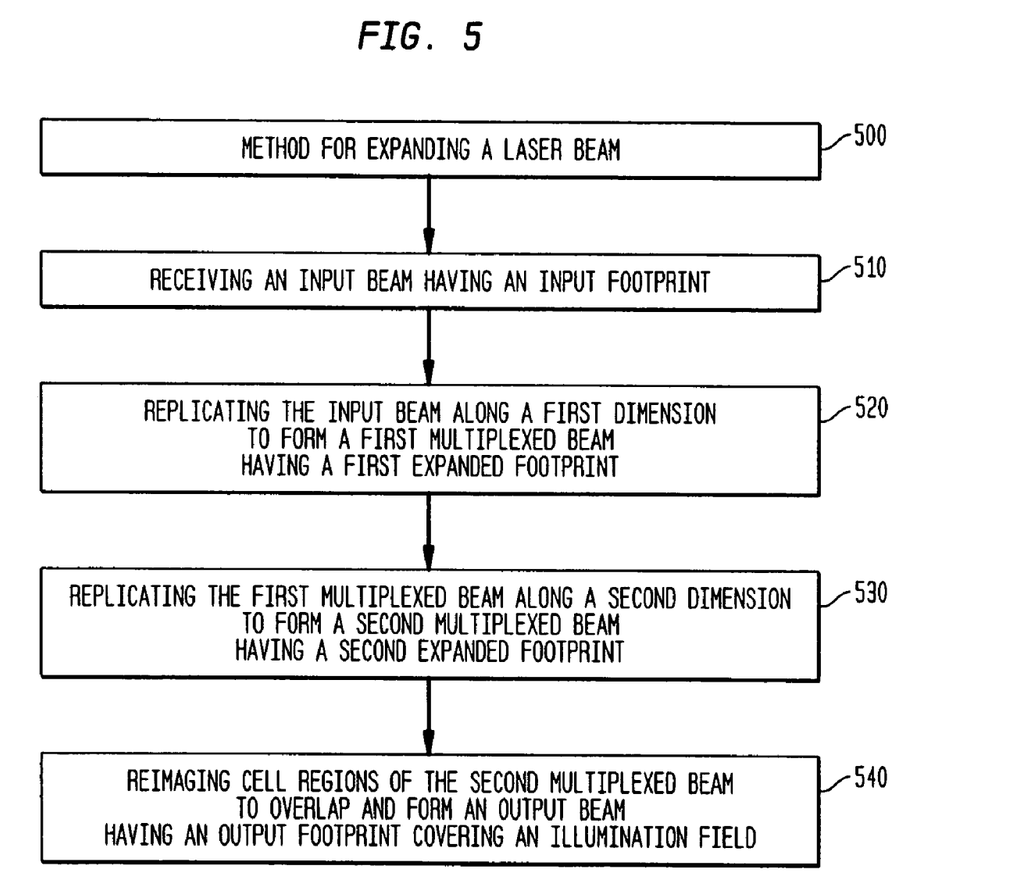
FIG. 5 is a flowchart diagram of a method for expanding a laser beam according to the present invention.

FIG. 5 is a flowchart diagram of a method for expanding laser beam 500 according to the present invention (steps 510–540). In step 510, an input beam is received having an input footprint. In step 520, an input beam is replicated along the first dimension to form a first multiplexed beam having a first expanded footprint. In step 530, the first multiplexed beam is replicated along a second dimension to form a second multiplexed beam having a second expanded footprint. In step 540, cell regions of the second multiplexed beam are reimaged to overlap and form an output beam. The output beam has an output footprint that covers an illumination field.

Method 500 and its constituent steps 510–540 can be carried out in an illumination system 110 as described above with respect to FIG. 2. The structure of illumination system 110 however is illustrative and not intended to limit method 500 or its steps 510 to 540.

Further Features and Discussion

Additional features and discussion of a system and method for laser beam expansion according to the present invention are discussed below. The additional features and discussion below is illustrative of embodiments of the present invention and not intended to necessarily limit the present invention.

According to a further advantage, the present invention can expand a laser beam with zero magnification by replication. The laser beam is partially split and transmitted and reflected so that multiple images of the beam are created in the horizontal direction first and then by additional splitting and reflections in the vertical direction. Alternatively, the design is such that if necessary, the beam can be split in the vertical direction first and then the horizontal direction.

In one embodiment, the systems and methods for expanding a laser beam are tailored to adjust the spatial coherence length using an anamorphic beam expander first and then expanding the beam by beam splitters and reflectors so that a plurality of spatial coherent cell images are produced but with no change in magnification. Furthermore, a phase shift is produced between each of the beams which is greater than the longitudinal coherence length of the laser so that the recreated images are all incoherent relative to the additional beams. This plurality of images is then directed to lenslets of either a microlens array or diffractive optical element. Each of these lenslets is then reimaged so that all of the images overlap having the net effect of reducing the contrast of any remaining interferences between the beams. A uniform light intensity is thus obtained in the reimaged region.

The length of the reflecting design of the horizontal reflective multiplexer and the vertical reflective multiplexer permits their use with very short bandwidth lasers in an approximate range of 10 picometer (pm) to 0.1 pm as listed in Table 1 below, and breaks up the longitudinal coherence of these types of lasers. Table 1 lists these 1.14× coherence length values for various bandwidths representing a lower design limit for ΔP for one example lithography tool and is not intended to limit the present invention:

TABLE 1

| Bandwidth (pm) | $\Delta P = 1.14 \times \lambda^2/\Delta\lambda$ (mm) | $\Delta P = 1.14 \times \lambda^2/\Delta\lambda$ (in) |
|---|---|---|
| 10 | 4.246 | .167 |
| 5 | 8.493 | .334 |
| 1 | 42.464 | 1.672 |
| .5 | 84.928 | 3.344 |
| .2 | 212.232 | 8.356 |
| .1 | 424.639 | 16.718 |

Before discussing how the above data can be used, it is helpful to examine the spatial coherence cell size. Individual cells are essentially independent of other cells within the laser output beam. According to the present invention, cell sizes can be increased (or decreased) in two directions. In one preferred example, cell sizes are desired to be equal. The next step is to introduce path length differences between laser beams to overcome the temporal coherence. If the laser beam from the laser source 104 is about 15 mm vertical and 5 mm horizontal, then there will be approximately 500 cells ((15/(0.17))×(5/1.2)). These sizes are based on an excimer laser which has a minimum bandwidth of 10 pm. The temporal coherence will increase as the bandwidth gets smaller. If the temporal coherence increases by a factor of 2 or more, then the resultant beams can be stepped differently.

As described above with respect to illumination system 110, the laser beam is first uniformly or anamorphically increased or decreased to obtain nearly equal cell sizes. The beam is then multiplexed with a reflective in air assembly in the narrow direction (N) (e.g., horizontal direction). It is next multiplexed again in the wide direction (e.g., vertical direction). The total number of cells is determined from $$C \times N \times W = T$$

where C=number of cells in the laser beam
N=number of laser patches in the narrow direction
W=number of laser patches in the wide direction
T=total number of cells T=10,000 for C=500, N=5 and W=4

The size of the illuminated field will be (for the above case)

$5b_h \cdot m_h$ in the horizontal direction
and $4b_v \cdot m_v$ in the vertical direction where b is the raw beam size in each direction and m is the magnification.

Once the cell size and beam sizes and ranges are defined by the laser manufacturer, an optimized design can be undertaken. This includes a range of sizes for the microlens array in two directions.

Consider an example horizontal reflective multiplexer (5× MUX) having calcium fluoride ($CaF_2$) beam splitters. For scaling purposes $\Delta P = 1.14 \, \lambda^2/\Delta\lambda$, first reflecting MUX, 5×, let the two beam splitters be described by transmittance values $T_1, T_2, T_3, T_4$ and the mirror transmittance value $T_M$ assuming no absorption A, the below Table 2 can be generated to describe the transmission T and reflections R of the MUX and transmission intensity output Tput relative to the intensity of the input beam as:

TABLE 2

|       | T    | R    | Tput |
|-------|------|------|------|
| $T_1$ | .2   | .8   | .2   |
| $T_2$ | .75  | .25  | .2   |
| $T_3$ | .333 | .666 | .2   |
| $T_4$ | .5   | .5   | .2   |
| $T_m$ | —    | 1    | .2   |
|       | Efficiency = |   | 1.0  |

If an absorption A is added:

|       | R    | T(1 − (A + R)) | Tput | A    |
|-------|------|----------------|------|------|
| $T_1$ | .8   | .19            | .19  | .01  |
| $T_2$ | .25  | .745           | .20  | .005 |
| $T_3$ | .666 | .324           | .185 | .01  |
| $T_4$ | .5   | .495           | .181 | .005 |
| $T_m$ | .96  | —              | .176 | .04  |
|       |      |                | .932 efficient |  |

In the above, absorption of the $C_aF_2$ beam splitter and scatter were not included. The beam splitter plate (assuming a front surface coating) can be about 20×6×3 mm thick in one example. Since it is traversed 4 times, then the additional loss will be 1−0.9975 1.2=1−0.993=003 or 0.3%. This means the absorption values will increase by approximately ¼ of this amount. Surface scatter contributes 0.005 for surface which results in $1−0.995^8=1.961=0.04$ so the efficiency will be 0.932×0.993×0.961=0.89.

Consider a vertical reflective multiplexer (4× MUX) arranged orthogonal to the output beam of the 5× MUX. Its coordinate system can be defined by an "x" into a page, "y" up and "z" right.

This 4× MUX must introduce an additional path length increase of one $\Delta P$ over the previous 5× MUX. Here, $\Delta P$ will be 5. This design (not to scale) will consist of one beam splitter plate and one mirror. As with the 5×, one has transmittance values $T_1, T_2, T_3$ and the mirror transmittance value $T_M$ assuming no absorption A, and the below Table 3 can be generated to describe the transmission T and reflections R of the 4× MUX and transmission intensity output Tput relative to the intensity of the input beam to the 4× MUX as:

TABLE 3

|       | T    | R    | Tput |
|-------|------|------|------|
| $T_1$ | .25  | .75  | .25  |
| $T_2$ | .333 | .666 | .2   |
| $T_3$ | .5   | .5   | .25  |
| $T_m$ | 8−   | 1    | .25  | with absorption A (coating only)

|       | A    | R    | T    | Tput |
|-------|------|------|------|------|
| $T_1$ | .01  | .75  | .24  | .24  |
| $T_2$ | .01  | .666 | .324 | .238 |
| $T_3$ | .005 | .5   | .46  | .237 |
| $T_m$ | .02  | .98  | 1.0  | .235 |
|       |      |      |      | .95  | where 125×15×10 scatter $0.995^6 = 0.97$ $CaF_2 \, 0.9975 = 0.9975$;

efficiency 0.95×0.97×0.9975=0.92; and in particular,

5× MUX effic.=0.89, 4× MUX effic.=0.92, and the total efficiency=0.82.

From the details of the 5× MUX, it can be seen that the overall length of that 5× MUX is approximately $\Delta P$ in one embodiment. For the 4× MUX, the overall length is 2.5 $\Delta P$ in one embodiment. One can now estimate the minimum overall structure length assuming zero mirror thickness and air space between the two MUX's. Table 4 below lists laser bandwidth values, coherence length values $\Delta P$ in mm and inches, 4× horizontal MUX length in mm and inches, and overall structure length in mm and inches:

TABLE 4

| Bandwidth | ΔP (mm) | ΔP (in) | VERTICAL MUX mm 2.5 × ΔP length | VERTICAL MUX in 2.5 × ΔP length | VERT. + HOR. MUX mm 2.5 × ΔP + ΔP Overall length | VERT. + HOR. MUX in 2.5 × ΔP + ΔP Overall length |
|---|---|---|---|---|---|---|
| 10 | 4.25 | .17 | 10.63 | 0.43 | 14.88 | 0.60 |
| 5 | 8.5 | .33 | 21.25 | 0.83 | 29.75 | 1.16 |
| 1 | 42.46 | 1.67 | 106.15 | 4.18 | 148.65 | 5.85 |
| .5 | 84.93 | 3.34 | 212.33 | 8.35 | 297.26 | 11.69 |
| .2 | 212.23 | 8.36 | 530.58 | 20.90 | 742.81 | 29.26 |
| .1 | 424.64 | 16.72 | 1061.60 | 41.80 | 1486.24 | 58.52 |

CONCLUSION

Example embodiments of the present invention have been described herein. As noted elsewhere, these example embodiments have been described for illustrative purposes only, and are not limiting. Other embodiments are possible and are covered by the invention. Such embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalence.

What is claimed is:

1. A photolithography system, comprising:
an illumination system;
a reticle stage;
projection optics; and
a wafer stage,
wherein the illumination system includes:
  a first reflective multiplexer that replicates an input beam along a first dimension to form a first multiplexed beam with spatially coherent cell regions;
  a second reflective multiplexer that replicates the first multiplexed beam along a second dimension to form a second multiplexed beam with spatially coherent cell regions; and
  an optical subsystem that re-images the second multiplexed beam such that substantially all spatially coherent cell regions overlap.

2. The photolithography system of claim 1, wherein the first dimension and the second dimension extend along respective first and second directions, the first and second directions being offset by an angle of approximately 90 degrees.

3. The photolithography system of claim 2, wherein the first direction and the second direction are each orthogonal to a direction of propagation of the input beam.

4. The photolithography system of claim 1, wherein the first reflective multiplexer replicates the input beam five times along the first dimension to form the first multiplexed beam.

5. The photolithography system of claim 4, wherein the second reflective multiplexer replicates the first multiplexed beam along the second dimension four times to form the second multiplexed beam.

6. The photolithography system of claim 1, wherein the first reflective multiplexer comprises:
a first beam splitter;
a second beam splitter; and
a mirror,
wherein the second beam splitter is arranged between the first beam splitter and the mirror.

7. The photolithography system of claim 1, wherein the second reflective multiplexer comprises:
a beam splitter; and
a mirror,
  wherein the mirror is arranged relative to the beam splitter in such a way that the first multiplexed beam is split by the beam splitter into transmitted and reflected beam portions, and the reflected beam portions are reflected by the mirror; and
  wherein the second multiplexed beam is made up of at least the transmitted beam portions transmitted through the beam splitter.

8. The photolithography system of claim 1, wherein the optical subsystem comprises a microlens array.

9. The photolithography system of claim 1, wherein the optical subsystem comprises a diffractive optical element.

10. The photolithography system of claim 1, wherein the illumination system receives illumination light from a laser.

11. The photolithography system of claim 10, wherein the laser is an excimer laser.

12. The photolithography system of claim 1, wherein the illumination system further comprises an anamorphic beam expander.

13. The photolithography system of claim 12, wherein the anamorphic beam expander comprises a cylindrical lens.

14. The photolithography system of claim 12, wherein the anamorphic beam expander reduces a footprint of the input beam in the first dimension and increases the footprint of the input beam in the second dimension.

15. The photolithography system of claim 1, wherein the illumination system further comprises a uniform beam expander.

* * * * *

UNITED STATES PATENT AND TRADEMARK OFFICE
CERTIFICATE OF CORRECTION

PATENT NO. : 7,006,198 B2  
APPLICATION NO. : 10/970411  
DATED : February 28, 2006  
INVENTOR(S) : Augustyn et al.

It is certified that error appears in the above-identified patent and that said Letters Patent is hereby corrected as shown below:

On the title page, in item (63), "Continuation-in-part" should be replaced with --Continuation--.

Signed and Sealed this

Twenty-second Day of August, 2006

JON W. DUDAS  
*Director of the United States Patent and Trademark Office*